(12) United States Patent
Hsu

(10) Patent No.: US 8,502,570 B2
(45) Date of Patent: Aug. 6, 2013

(54) HIGH EFFICIENCY DRIVING CIRCUIT

(75) Inventor: Kuang-Yu Hsu, Taoyuan County (TW)

(73) Assignee: AMICCOM Electronics Corporation, Hsinchu Science Park, Hsin-Chu (TW)

( * ) Notice: Subject to any disclaimer, the term of this patent is extended or adjusted under 35 U.S.C. 154(b) by 223 days.

(21) Appl. No.: 13/228,427

(22) Filed: Sep. 8, 2011

(65) Prior Publication Data

US 2013/0049811 A1  Feb. 28, 2013

(30) Foreign Application Priority Data

Aug. 23, 2011 (TW) .............................. 100130125 A

(51) Int. Cl.
*H03K 3/00* (2006.01)
(52) U.S. Cl.
USPC .......................................... 327/108; 327/109
(58) Field of Classification Search
USPC ................................. 327/108, 109
See application file for complete search history.

(56) References Cited

U.S. PATENT DOCUMENTS

| 5,929,665 | A  | * | 7/1999  | Ichikawa et al. | 327/109 |
|-----------|----|---|---------|-----------------|---------|
| 6,005,366 | A  | * | 12/1999 | Majumdar et al. | 318/811 |
| 6,335,608 | B1 | * | 1/2002  | Takahashi       | 318/811 |
| 6,404,659 | B1 | * | 6/2002  | Oyabe           | 363/132 |
| 2005/0116748 | A1 | * | 6/2005 | Deppe           | 327/112 |
| 2009/0078045 | A1 | * | 3/2009 | Kanai et al.    | 73/584  |

* cited by examiner

*Primary Examiner* — Ryan Jager
(74) *Attorney, Agent, or Firm* — Winston Hsu; Scott Margo

(57) ABSTRACT

A high efficiency driving circuit includes a first P-type metal-oxide-semiconductor transistor, a second P-type metal-oxide-semiconductor transistor, a first N-type metal-oxide-semiconductor transistor, a second N-type metal-oxide-semiconductor transistor, a current source, a third N-type metal-oxide-semiconductor transistor, a fourth N-type metal-oxide-semiconductor transistor, a fifth N-type metal-oxide-semiconductor transistor, a first resistor, and a second resistor. The first P-type metal-oxide-semiconductor transistor charges a third terminal of the first P-type metal-oxide-semiconductor transistor according to a first control signal, and the first N-type metal-oxide-semiconductor transistor discharges the third terminal of the first P-type metal-oxide-semiconductor transistor according to a second control signal. A high voltage level of the first control signal is at a first voltage, and a low voltage level of the first control signal is at a third voltage; a high voltage level of the second control signal is at a fourth voltage, and a low voltage level of the second control signal is ground.

24 Claims, 4 Drawing Sheets

HIGH EFFICIENCY DRIVING CIRCUIT

BACKGROUND OF THE INVENTION

1. Field of the Invention

The present invention is related to a driving circuit, and particularly to a driving circuit that can be applied to a direct current voltage/direct current voltage converter of a partial high voltage complementary metal-oxide-semiconductor process.

2. Description of the Prior Art

Please refer to FIG. 1. FIG. 1 is a diagram illustrating a direct current voltage/direct current voltage converter 100 according to the prior art. The direct current voltage/direct current voltage converter 100 includes a buffer 102 and a switch 104, where the switch 104 is a P-type metal-oxide-semiconductor transistor. In a partial high voltage complementary metal-oxide-semiconductor process (that is, a process in which a drain of a metal-oxide-semiconductor transistor can endure a high voltage, but thickness of a gate of the metal-oxide-semiconductor transistor is not increased), because a gate of the switch 104 can not endure a high voltage, voltage levels of a control signal CS generated by the buffer 102 must be between a first voltage HV and a low voltage LV, where the low voltage LV is equal to the first voltage HV minus a source-to-gate voltage VSG of the switch 104.

In the prior art, because size of the switch 104 is very large and the switch 104 is a metal-oxide-semiconductor transistor of the partial high voltage complementary metal-oxide-semiconductor process, the buffer 102 requires very large current to generate the control signal CS and switch the switch 104 rapidly, resulting in energy conversion efficiency of the direct current voltage/direct current voltage converter 100 being lower.

SUMMARY OF THE INVENTION

An embodiment provides a high efficiency driving circuit. The high efficiency driving circuit includes a first P-type metal-oxide-semiconductor transistor, a second P-type metal-oxide-semiconductor transistor, a first N-type metal-oxide-semiconductor transistor, a second N-type metal-oxide-semiconductor transistor, a current source, a third N-type metal-oxide-semiconductor transistor, a fourth N-type metal-oxide-semiconductor transistor, a fifth N-type metal-oxide-semiconductor transistor, a first resistor, and a second resistor. The first P-type metal-oxide-semiconductor transistor has a first terminal for receiving a first voltage, a second terminal for receiving a first control signal, and a third terminal for coupling to a third P-type metal-oxide-semiconductor transistor. The second P-type metal-oxide-semiconductor transistor has a first terminal for receiving the first voltage, a second terminal for coupling to the third P-type metal-oxide-semiconductor transistor, and a third terminal. The first N-type metal-oxide-semiconductor transistor has a first terminal coupled to the third terminal of the first P-type metal-oxide-semiconductor transistor, a second terminal for receiving a second control signal, and a third terminal. The second N-type metal-oxide-semiconductor transistor has a first terminal coupled to the third terminal of the first N-type metal-oxide-semiconductor transistor, a second terminal, and a third terminal coupled to ground. The current source has a first terminal for receiving a second voltage, and a second terminal, where the current source is used for providing first current. The third N-type metal-oxide-semiconductor transistor has a first terminal coupled to the second terminal of the current source, a second terminal coupled to the first terminal of the third N-type metal-oxide-semiconductor transistor and the second terminal of the second N-type metal-oxide-semiconductor transistor, and a third terminal coupled to the ground. The fourth N-type metal-oxide-semiconductor transistor has a first terminal coupled to the second terminal of the current source, a second terminal, and a third terminal. The fifth N-type metal-oxide-semiconductor transistor has a first terminal coupled to the third terminal of the second P-type metal-oxide-semiconductor transistor, a second terminal coupled to the first terminal of the fifth N-type metal-oxide-semiconductor transistor and the second terminal of the fourth N-type metal-oxide-semiconductor transistor, and a third terminal coupled to the ground. The first resistor has a first terminal for receiving the first voltage, and a second terminal for coupling to the third P-type metal-oxide-semiconductor transistor. The second resistor has a first terminal coupled to the third terminal of the fourth N-type metal-oxide-semiconductor transistor, and a second terminal for coupling to the ground.

Another embodiment provides a high efficiency driving circuit. The high efficiency driving circuit includes a third P-type metal-oxide-semiconductor transistor, a first P-type metal-oxide-semiconductor transistor, a second P-type metal-oxide-semiconductor transistor, a first N-type metal-oxide-semiconductor transistor, a second N-type metal-oxide-semiconductor transistor, a current source, a third N-type metal-oxide-semiconductor transistor, a fourth N-type metal-oxide-semiconductor transistor, a fifth N-type metal-oxide-semiconductor transistor, a first resistor, and a second resistor. The third P-type metal-oxide-semiconductor transistor has a first terminal for receiving a first voltage, a second terminal, and a third terminal for coupling to a load. The first P-type metal-oxide-semiconductor transistor has a first terminal for receiving the first voltage, a second terminal for receiving a first control signal, and a third terminal coupled to the second terminal of the third P-type metal-oxide-semiconductor transistor. The second P-type metal-oxide-semiconductor transistor has a first terminal for receiving the first voltage, a second terminal coupled to the second terminal of the third P-type metal-oxide-semiconductor transistor, and a third terminal. The first N-type metal-oxide-semiconductor transistor has a first terminal coupled to the third terminal of the first P-type metal-oxide-semiconductor transistor, a second terminal for receiving a second control signal, and a third terminal. The second N-type metal-oxide-semiconductor transistor has a first terminal coupled to the third terminal of the first N-type metal-oxide-semiconductor transistor, a second terminal, and a third terminal coupled to ground. The current source has a first terminal for receiving a second voltage, and a second terminal, where the current source is used for providing first current. The third N-type metal-oxide-semiconductor transistor has a first terminal coupled to the second terminal of the current source, a second terminal coupled to the first terminal of the third N-type metal-oxide-semiconductor transistor and the second terminal of the second N-type metal-oxide-semiconductor transistor, and a third terminal coupled to the ground. The fourth N-type metal-oxide-semiconductor transistor has a first terminal coupled to the second terminal of the current source, a second terminal, and a third terminal. The fifth N-type metal-oxide-semiconductor transistor has a first terminal coupled to the third terminal of the second P-type metal-oxide-semiconductor transistor, a second terminal coupled to the first terminal of the fifth N-type metal-oxide-semiconductor transistor and the second terminal of the fourth N-type metal-oxide-semiconductor transistor, and a third terminal coupled to the ground. The first resistor has a first terminal for receiving the first voltage, and a second terminal coupled to the second terminal of the third P-type metal-oxide-semiconductor transistor. The second resistor has a first terminal coupled to the third terminal of the fourth N-type metal-oxide-semiconductor transistor, and a second terminal for coupling to the ground.

The present invention provides a high efficiency driving circuit. The high efficiency driving circuit utilizes a first P-type metal-oxide-semiconductor transistor and a first N-type metal-oxide-semiconductor transistor of the high efficiency driving circuit to be turned on according to a first control signal and a second control signal respectively for a voltage of a third terminal of the first P-type metal-oxide-semiconductor transistor (that is, a voltage of a second terminal of a third P-type metal-oxide-semiconductor transistor) to be between the first voltage and the third voltage. Thus, the voltage of the third terminal of the first P-type metal-oxide-semiconductor transistor does not damage the third P-type metal-oxide-semiconductor transistor (because the second terminal of the third P-type metal-oxide-semiconductor transistor is not a gate terminal of a high voltage metal-oxide-semiconductor process). In addition, the voltage of the third terminal of the first P-type metal-oxide-semiconductor transistor is increased/decreased rapidly, and an absolute value of current is only increased at the beginning of turning-on of the first P-type metal-oxide-semiconductor transistor and the beginning of turning-on of the first N-type metal-oxide-semiconductor transistor (that is, an average value of the absolute value of the current is very small). Therefore, compared to the prior art, the high efficiency driving circuit can not only turn on and turn off the third P-type metal-oxide-semiconductor transistor rapidly, but also have higher efficiency.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
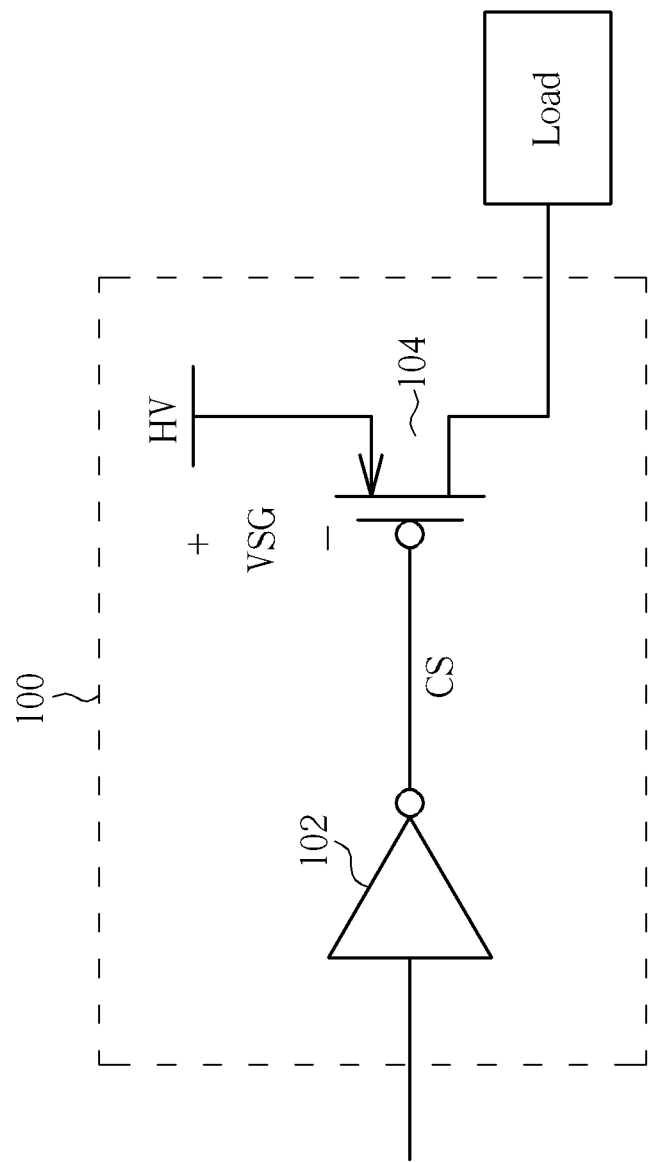
FIG. 1 is a diagram illustrating a direct current voltage/direct current voltage converter according to the prior art.
Figure 2:
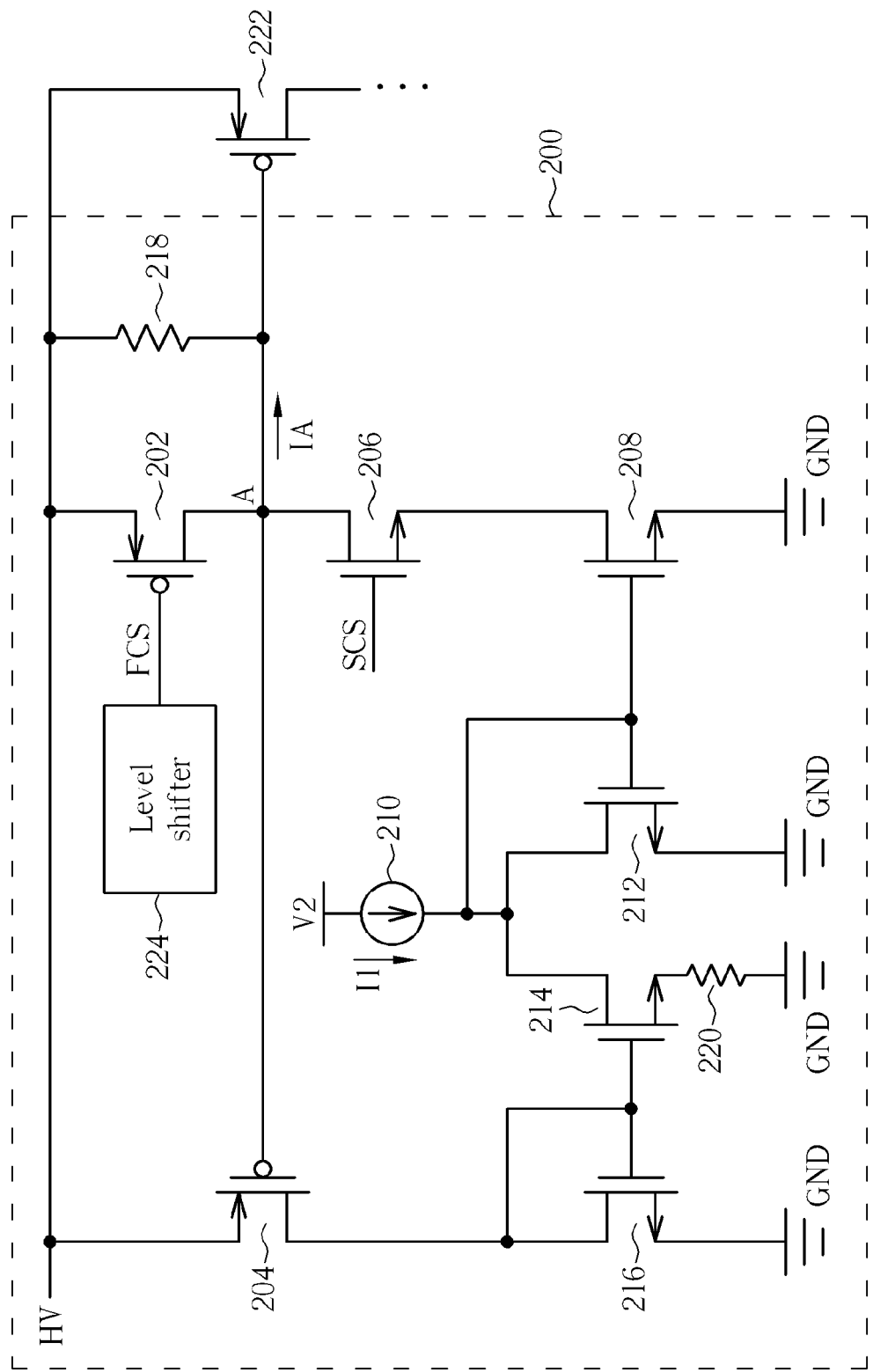
FIG. 2 is a diagram illustrating a high efficiency driving circuit according to an embodiment.

Please refer to FIG. 2. FIG. 2 is a diagram illustrating a high efficiency driving circuit 200 according to an embodiment. The high efficiency driving circuit 200 includes a first P-type metal-oxide-semiconductor transistor 202, a second P-type metal-oxide-semiconductor transistor 204, a first N-type metal-oxide-semiconductor transistor 206, a second N-type metal-oxide-semiconductor transistor 208, a current source 210, a third N-type metal-oxide-semiconductor transistor 212, a fourth N-type metal-oxide-semiconductor transistor 214, a fifth N-type metal-oxide-semiconductor transistor 216, a first resistor 218, and a second resistor 220. The first P-type metal-oxide-semiconductor transistor 202 has a first terminal for receiving a first voltage HV, a second terminal for receiving a first control signal FCS, and a third terminal for coupling to a third P-type metal-oxide-semiconductor transistor 222, where the third P-type metal-oxide-semiconductor transistor 222 is a P-type metal-oxide-semiconductor transistor of a partial high voltage complementary metal-oxide-semiconductor process. That is to say, a third terminal of the third P-type metal-oxide-semiconductor transistor 222 is a drain terminal of a high voltage metal-oxide-semiconductor process, and a second terminal of the third P-type metal-oxide-semiconductor transistor 222 is not a gate terminal of the high voltage metal-oxide-semiconductor process. In addition, the first control signal FCS is provided by a level shifter 224. The second P-type metal-oxide-semiconductor transistor 204 has a first terminal for receiving the first voltage HV, a second terminal for coupling to the third P-type metal-oxide-semiconductor transistor 222, and a third terminal. The first N-type metal-oxide-semiconductor transistor 206 has a first terminal coupled to the third terminal of the first P-type metal-oxide-semiconductor transistor 202, a second terminal for receiving a second control signal SCS, and a third terminal. The second N-type metal-oxide-semiconductor transistor 208 has a first terminal coupled to the third terminal of the first N-type metal-oxide-semiconductor transistor 206, a second terminal, and a third terminal coupled to ground GND. The current source 210 has a first terminal for receiving a second voltage V2, and a second terminal, where the current source 210 is used for providing a first current I1. The third N-type metal-oxide-semiconductor transistor 212 has a first terminal coupled to the second terminal of the current source 210, a second terminal coupled to the first terminal of the third N-type metal-oxide-semiconductor transistor 212 and the second terminal of the second N-type metal-oxide-semiconductor transistor 208, and a third terminal coupled to the ground GND. A width over length ratio of the second N-type metal-oxide-semiconductor transistor 208 is N times a width over length ratio of the third N-type metal-oxide-semiconductor transistor 212, and N>1. The fourth N-type metal-oxide-semiconductor transistor 214 has a first terminal coupled to the second terminal of the current source 210, a second terminal, and a third terminal. The fifth N-type metal-oxide-semiconductor transistor 216 has a first terminal coupled to the third terminal of the second P-type metal-oxide-semiconductor transistor 204, a second terminal coupled to the first terminal of the fifth N-type metal-oxide-semiconductor transistor 216 and the second terminal of the fourth N-type metal-oxide-semiconductor transistor 214, and a third terminal coupled to the ground GND. The first resistor 218 has a first terminal for receiving the first voltage HV, and a second terminal for coupling to the third P-type metal-oxide-semiconductor transistor 222, where the first resistor 218 is used for stabilizing a voltage of the third terminal of the first P-type metal-oxide-semiconductor transistor 202. The second resistor 220 has a first terminal coupled to the third terminal of the fourth N-type metal-oxide-semiconductor transistor 214, and a second terminal for coupling to the ground GND, where the second resistor 220 is used for reducing closed loop gain of the high efficiency driving circuit 200 to stabilize the high efficiency driving circuit 200.

Figure 3:
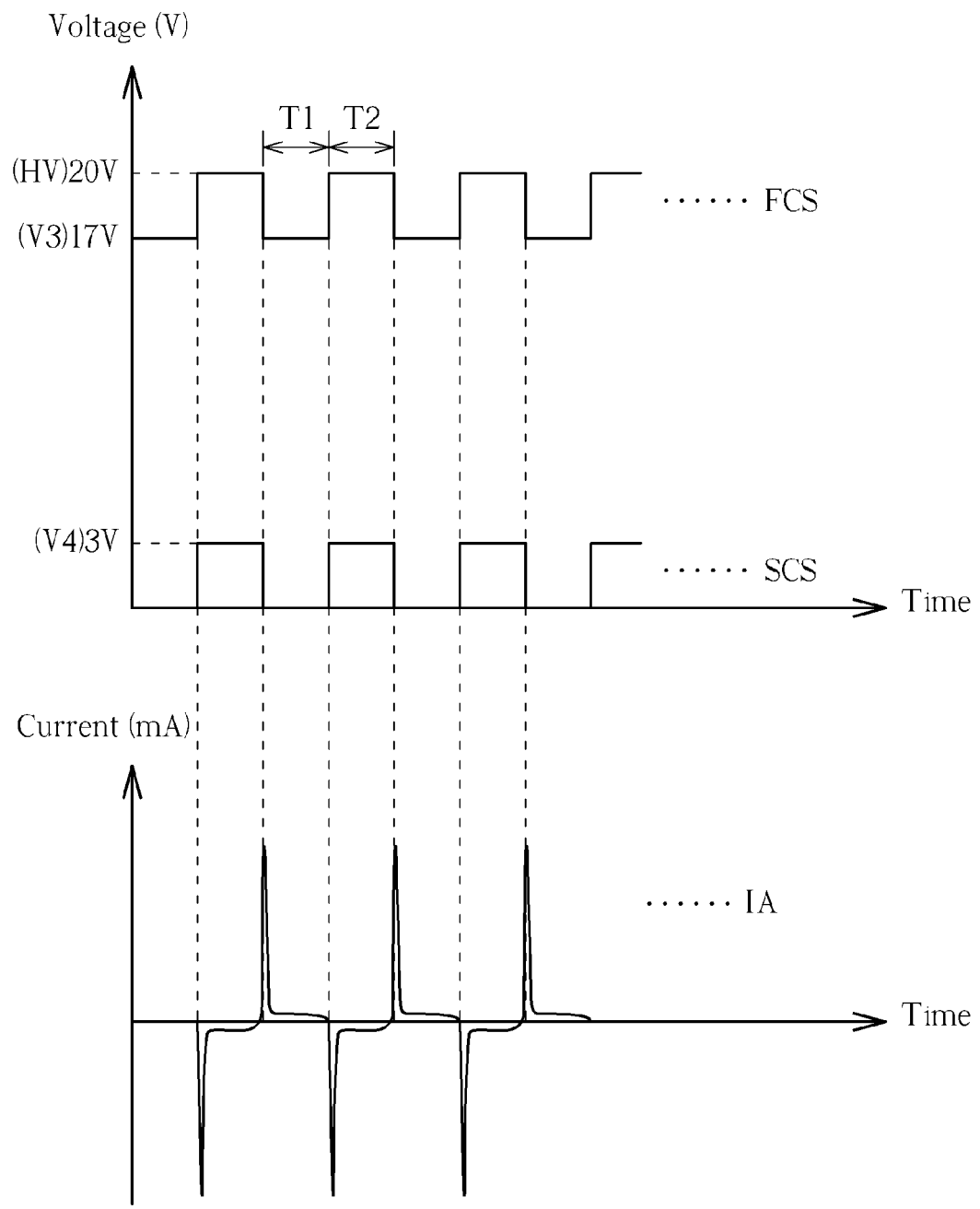
FIG. 3 is a timing diagram illustrating the first control signal, the second control signal and current flowing through a node.

Please refer to FIG. 3. FIG. 3 is a timing diagram illustrating the first control signal FCS, the second control signal SCS and current IA flowing through a node A. As shown in FIG. 3, a high voltage level of the first control signal FCS is the first voltage HV (such as 20V), and a low voltage level of the first control signal FCS is a third voltage V3 (such as 17V). But, the present invention is not limited to the first voltage HV being 20V and the third voltage V3 being 17V. As shown in FIG. 3, a high voltage level of the second control signal SCS is a fourth voltage V4 (such as 3V), and a low voltage level of the second control signal SCS is the ground GND (0V). But, the present invention is not limited to the fourth voltage being 3V. In addition, because a frequency of the first control signal FCS is the same as a frequency of the second control signal SCS, the first P-type metal-oxide-semiconductor transistor 202 and the first N-type metal-oxide-semiconductor transistor 206 are not turned on and turned off simultaneously.

As shown in FIG. 2 and FIG. 3, when the first P-type metal-oxide-semiconductor transistor 202 is turned on instantly according to the first control signal FCS (an interval T1), the current IA is increased rapidly, resulting in the voltage of the third terminal (node A) of the first P-type metal-oxide-semiconductor transistor 202 being also increased rapidly. When the voltage of the third terminal (node A) of the first P-type metal-oxide-semiconductor transistor 202 is increased to the first voltage HV and maintained at the first voltage HV, the current IA becomes very small. In addition, when the first N-type metal-oxide-semiconductor transistor 206 is turned on instantly according to the second control signal SCS (an interval T2), because the width over length ratio of the second N-type metal-oxide-semiconductor transistor 208 is N times the width over length ratio of the third N-type metal-oxide-semiconductor transistor 212, and the second P-type metal-oxide-semiconductor transistor 204 is turned off (because a voltage of node A is at the first voltage HV), the first current I1 totally flows through the third N-type metal-oxide-semiconductor transistor 212, resulting in the current IA (the current IA is N times the first current I1) being decreased rapidly. Thus, the voltage of the third terminal (node A) of the first P-type metal-oxide-semiconductor transistor 202 is also decreased to the third voltage V3. In addition, during the voltage of the third terminal (node A) of the first P-type metal-oxide-semiconductor transistor 202 being decreased to the third voltage V3, the second P-type metal-oxide-semiconductor transistor 204 is turned on rapidly, so that the current IA is increased rapidly. Therefore, when the voltage of the third terminal (node A) of the first P-type metal-oxide-semiconductor transistor 202 (node A) is decreased to the third voltage V3 and maintained at the third voltage V3, the current IA also becomes very small.

Figure 4:
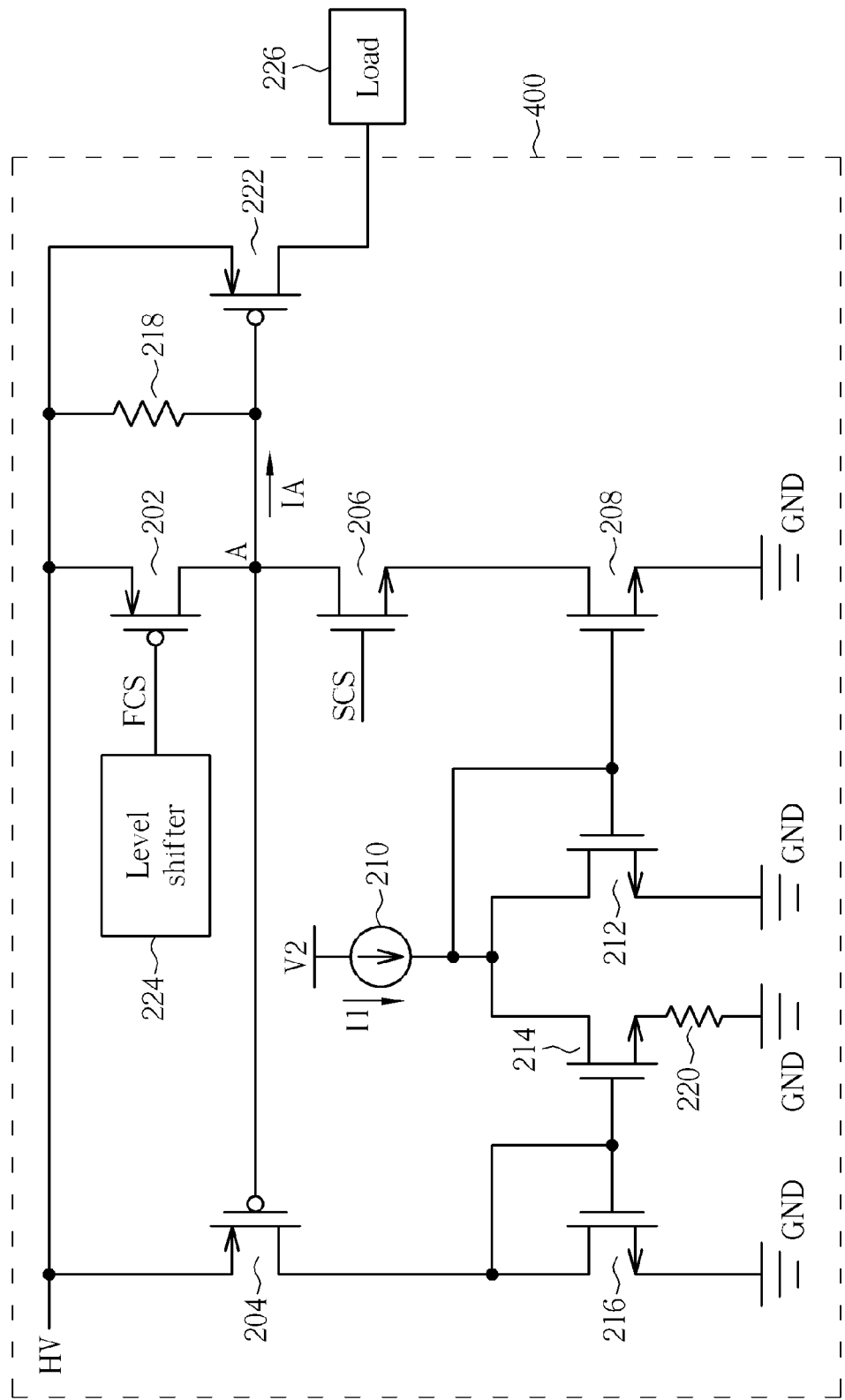
FIG. 4 is a diagram illustrating a high efficiency driving circuit according to another embodiment.

Please refer to FIG. 4. FIG. 4 is a diagram illustrating a high efficiency driving circuit 400 according to another embodiment. As shown in FIG. 4, a difference between the high efficiency driving circuit 400 and the high efficiency driving circuit 200 is that the high efficiency driving circuit 400 further includes the third P-type metal-oxide-semiconductor transistor 222. The third P-type metal-oxide-semiconductor transistor 222 has a first terminal for receiving the first voltage HV, a second terminal coupled to the third terminal of the first P-type metal-oxide-semiconductor transistor 202, and a third terminal for coupling a load 226. The third terminal of the third P-type metal-oxide-semiconductor transistor 222 is a drain terminal of the high voltage metal-oxide-semiconductor process, and the second terminal of the third P-type metal-oxide-semiconductor transistor 222 is not a gate terminal of the high voltage metal-oxide-semiconductor process. Further, subsequent operational principles of the high efficiency driving circuit 400 are the same as those of the high efficiency driving circuit 100, so further description thereof is omitted for simplicity.

To sum up, the high efficiency driving circuit utilizes the first P-type metal-oxide-semiconductor transistor and the first N-type metal-oxide-semiconductor transistor of the high efficiency driving circuit to be turned on according to the first control signal and the second control signal respectively for the voltage of the third terminal of the first P-type metal-oxide-semiconductor transistor (that is, a voltage of the second terminal of the third P-type metal-oxide-semiconductor transistor) to be between the first voltage and the third voltage. Thus, the voltage of the third terminal of the first P-type metal-oxide-semiconductor transistor does not damage the third P-type metal-oxide-semiconductor transistor (because the second terminal of the third P-type metal-oxide-semiconductor transistor is not the gate terminal of the high voltage metal-oxide-semiconductor process). In addition, the voltage of the third terminal of the first P-type metal-oxide-semiconductor transistor is increased/decreased rapidly, and an absolute value of the current is only increased at the beginning of turning-on of the first P-type metal-oxide-semiconductor transistor and the beginning of turning-on of the first N-type metal-oxide-semiconductor transistor (that is, an average value of the absolute value of the current is very small). Therefore, compared to the prior art, the high efficiency driving circuit can not only turn on and turn off the third P-type metal-oxide-semiconductor transistor rapidly, but also have higher efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high efficiency driving circuit, comprising:
   a first P-type metal-oxide-semiconductor transistor having a first terminal for receiving a first voltage, a second terminal for receiving a first control signal, and a third terminal for coupling to a third P-type metal-oxide-semiconductor transistor;
   a second P-type metal-oxide-semiconductor transistor having a first terminal for receiving the first voltage, a second terminal for coupling to the third P-type metal-oxide-semiconductor transistor, and a third terminal;
   a first N-type metal-oxide-semiconductor transistor having a first terminal coupled to the third terminal of the first P-type metal-oxide-semiconductor transistor, a second terminal for receiving a second control signal, and a third terminal;
   a second N-type metal-oxide-semiconductor transistor having a first terminal coupled to the third terminal of the first N-type metal-oxide-semiconductor transistor, a second terminal, and a third terminal coupled to ground;
   a current source having a first terminal for receiving a second voltage, and a second terminal, wherein the current source is used for providing first current;
   a third N-type metal-oxide-semiconductor transistor having a first terminal coupled to the second terminal of the current source, a second terminal coupled to the first terminal of the third N-type metal-oxide-semiconductor transistor and the second terminal of the second N-type metal-oxide-semiconductor transistor, and a third terminal coupled to the ground;
   a fourth N-type metal-oxide-semiconductor transistor having a first terminal coupled to the second terminal of the current source, a second terminal, and a third terminal;
   a fifth N-type metal-oxide-semiconductor transistor having a first terminal coupled to the third terminal of the second P-type metal-oxide-semiconductor transistor, a second terminal coupled to the first terminal of the fifth N-type metal-oxide-semiconductor transistor and the second terminal of the fourth N-type metal-oxide-semiconductor transistor, and a third terminal coupled to the ground;
   a first resistor having a first terminal for receiving the first voltage, and a second terminal for coupling to the third P-type metal-oxide-semiconductor transistor; and a second resistor having a first terminal coupled to the third terminal of the fourth N-type metal-oxide-semiconductor transistor, and a second terminal coupled to the ground.

2. The high efficiency driving circuit of claim 1, wherein a third terminal of the third P-type metal-oxide-semiconductor transistor is a drain terminal of a high voltage metal-oxide-semiconductor process, and the second terminal of the third P-type metal-oxide-semiconductor transistor is not a gate terminal of the high voltage metal-oxide-semiconductor process.

3. The high efficiency driving circuit of claim 1, wherein a width over length ratio of the second N-type metal-oxide-semiconductor transistor is greater than a width over length ratio of the third N-type metal-oxide-semiconductor transistor.

4. The high efficiency driving circuit of claim 1, wherein the first control signal is provided by a level shifter.

5. The high efficiency driving circuit of claim 1, wherein a high voltage level of the first control signal is the first voltage, and a low voltage level of the first control signal is a third voltage.

6. The high efficiency driving circuit of claim 1, wherein a high voltage level of the second control signal is a fourth voltage, and a low voltage level of the second control signal is at the ground.

7. The high efficiency driving circuit of claim 1, wherein a high voltage level of a voltage of the third terminal of the first P-type metal-oxide-semiconductor transistor is the first voltage, and a low voltage level of the voltage of the third terminal of the first P-type metal-oxide-semiconductor transistor is a third voltage.

8. The high efficiency driving circuit of claim 1, wherein the first resistor is used for stabilizing a voltage of the third terminal of the first P-type metal-oxide-semiconductor transistor.

9. The high efficiency driving circuit of claim 1, wherein the second resistor is used for reducing closed loop gain of the high efficiency driving circuit to stabilize the high efficiency driving circuit.

10. The high efficiency driving circuit of claim 1, wherein a voltage of the third terminal of the first P-type metal-oxide-semiconductor transistor is increased when the first P-type metal-oxide-semiconductor transistor is turned on according to the first control signal; and the voltage of the third terminal of the first P-type metal-oxide-semiconductor transistor is decreased when the first N-type metal-oxide-semiconductor transistor is turned on according to the second control signal.

11. The high efficiency driving circuit of claim 1, wherein a frequency of the first control signal is the same as a frequency of the second control signal.

12. The high efficiency driving circuit of claim 1, wherein the first P-type metal-oxide-semiconductor transistor and the first N-type metal-oxide-semiconductor transistor are not turned on and turned off simultaneously.

13. A high efficiency driving circuit, comprising:
a third P-type metal-oxide-semiconductor transistor having a first terminal for receiving a first voltage, a second terminal, and a third terminal for coupling to a load;
a first P-type metal-oxide-semiconductor transistor having a first terminal for receiving the first voltage, a second terminal for receiving a first control signal, and a third terminal coupled to the second terminal of the third P-type metal-oxide-semiconductor transistor;
a second P-type metal-oxide-semiconductor transistor having a first terminal for receiving the first voltage, a second terminal coupled to the second terminal of the third P-type metal-oxide-semiconductor transistor, and a third terminal;
a first N-type metal-oxide-semiconductor transistor having a first terminal coupled to the third terminal of the first P-type metal-oxide-semiconductor transistor, a second terminal for receiving a second control signal, and a third terminal;
a second N-type metal-oxide-semiconductor transistor having a first terminal coupled to the third terminal of the first N-type metal-oxide-semiconductor transistor, a second terminal, and a third terminal coupled to ground;
a current source having a first terminal for receiving a second voltage, and a second terminal, wherein the current source is used for providing first current;
a third N-type metal-oxide-semiconductor transistor having a first terminal coupled to the second terminal of the current source, a second terminal coupled to the first terminal of the third N-type metal-oxide-semiconductor transistor and the second terminal of the second N-type metal-oxide-semiconductor transistor, and a third terminal coupled to the ground;
a fourth N-type metal-oxide-semiconductor transistor having a first terminal coupled to the second terminal of the current source, a second terminal, and a third terminal;
a fifth N-type metal-oxide-semiconductor transistor having a first terminal coupled to the third terminal of the second P-type metal-oxide-semiconductor transistor, a second terminal coupled to the first terminal of the fifth N-type metal-oxide-semiconductor transistor and the second terminal of the fourth N-type metal-oxide-semiconductor transistor, and a third terminal coupled to the ground;
a first resistor having a first terminal for receiving the first voltage, and a second terminal coupled to the second terminal of the third P-type metal-oxide-semiconductor transistor; and
a second resistor having a first terminal coupled to the third terminal of the fourth N-type metal-oxide-semiconductor transistor, and a second terminal coupled to the ground.

14. The high efficiency driving circuit of claim 13, wherein the third terminal of the third P-type metal-oxide-semiconductor transistor is a drain terminal of a high voltage metal-oxide-semiconductor process, and the second terminal of the third P-type metal-oxide-semiconductor transistor is not a gate terminal of the high voltage metal-oxide-semiconductor process.

15. The high efficiency driving circuit of claim 13, wherein a width over length ratio of the second N-type metal-oxide-semiconductor transistor is greater than a width over length ratio of the third N-type metal-oxide-semiconductor transistor.

16. The high efficiency driving circuit of claim 13, wherein the first control signal is provided by a level shifter.

17. The high efficiency driving circuit of claim 13, wherein a high voltage level of the first control signal is the first voltage, and a low voltage level of the first control signal is a third voltage.

18. The high efficiency driving circuit of claim 13, wherein a high voltage level of the second control signal is a fourth voltage, and a low voltage level of the second control signal is at the ground.

19. The high efficiency driving circuit of claim 13, wherein a high voltage level of a voltage of the third terminal of the first P-type metal-oxide-semiconductor transistor is the first voltage, and a low voltage level of the voltage of the third terminal of the first P-type metal-oxide-semiconductor transistor is a third voltage.

20. The high efficiency driving circuit of claim 13, wherein the first resistor is used for stabilizing a voltage of the third terminal of the first P-type metal-oxide-semiconductor transistor.

21. The high efficiency driving circuit of claim 13, wherein the second resistor is used for reducing closed loop gain of the high efficiency driving circuit to stabilize the high efficiency driving circuit.

22. The high efficiency driving circuit of claim 13, wherein a voltage of the third terminal of the first P-type metal-oxide-semiconductor transistor is increased when the first P-type metal-oxide-semiconductor transistor is turned on according to the first control signal; and the voltage of the third terminal of the first P-type metal-oxide-semiconductor transistor is decreased when the first N-type metal-oxide-semiconductor transistor is turned on according to the second control signal.

23. The high efficiency driving circuit of claim 13, wherein a frequency of the first control signal is the same as a frequency of the second control signal.

24. The high efficiency driving circuit of claim 13, wherein the first P-type metal-oxide-semiconductor transistor and the first N-type metal-oxide-semiconductor transistor are not turned on and turned off simultaneously.

* * * * *